United States Patent Office 3,551,148

Patented Dec. 29, 1970

3,551,148

PROCESS FOR THE PRODUCTION OF PRINTING PLATES

Gerhard Faulhaber, Mennheim, Herbert Henkler, Darmstadt, Hans Wilhelm, Ludwigshafen (Rhine), Rudolf Brodt, Weinheim an der Bergstrasse, and Josef Georg Floss, Ludwigshafen (Rhine), Germany, assignors to Badische Anilin- & Soda-Fabrik Aktiengesellschaft, Ludwigshafen (Rhine), Germany No Drawing. Filed Mar. 16, 1967, Ser. No. 623,553

Claims priority, application Germany, Mar. 22, 1966, 1,522,463

Int. Cl. G03c *1/68, 5/00*

U.S. Cl. 96—35.1 11 Claims

ABSTRACT OF THE DISCLOSURE

A process for the production of printing plates based on linear synthetic polyamides and monomers which have polymerizable double bonds and which also contain etherified N-methylolamide groups.

This invention relates to a process for the production of printing plates of synthetic linear polyamides.

It is known that printing plates can be prepared by exposing plates or sheets of a mixture of a highly polymerized cellulose derivative with an unsaturated monomer, which has more than one polymerizable double bond, and a photoinitiator to light through a negative or positive and then removing the unexposed areas with a suitable solvent down to the desired depth. These printing plates are suitable for letterpress printing and dry offset printing. Plates of this type are not always sufficiently resistant to abrasion and cannot be manufactured reproducibly.

It is also known that plates and sheets of linear saturated synthetic polyamides, monomers having at least two double bonds and photoinitiators can be used for the production of printing plates. If the monomers are used in a weight ratio of 1 to 20% with reference to the whole mixture, the plates obtained after exposure to light through a negative or positive followed by development with conventional solvents have a light sensitivity and an image sharpness which are not always satisfactory. On the other hand, if an attempt is made to add the monomers in higher concentrations, for example more than 20%, a problem which is usually encountered is that such amounts do not dissolve completely in the polyamides and therefore result in cloudiness, exudation and inhomogeneities in the plates.

The compatibility of the polyamides with the monomers has therefore been improved by using polyamides which have first been methylolated followed by etherification of the methylol groups. When using such mixtures, there is a risk that undesired crosslinking may take place prematurely during the production of the plates and sheets. Moreover, the plates and sheets lack stability in storage.

It is an object of this invention to provide a process for the production of printing plates by exposing plates or sheets of mixtures of 75 to 30% by weight of a synthetic linear polyamide, 25 to 70% by weight of monomers having polymerizable double bonds and a photoinitiator to light through a negative or positive followed by removal of the unexposed areas, wherein monomers, which have double bonds and which also contain etherified N-methylolamide groups, are used.

It is a further object of this invention to provide a process for the production of printing plates, wherein the monomers containing etherified N-methylolamide groups are used together with other polymerizable monomers.

It is surprising that the compounds used according to this invention either on their own or in admixture with other monomers do not sweat out of unexposed plates or sheets with the result that they can be stored for several months. The monomers used according to the invention enable printing reliefs of exceptional fineness to be manufactured which in addition are characterized by a very even and smooth surface. A further advantage is that the relief image has smooth, sloping shoulders with sharp edges after the unexposed areas have been removed. In these respects the new printing plates are superior to the prior art plates based on polyamides. The new mixtures for the purposes of this invention have the advantage that, when the granulated material is processed into plates, the individual particles do not have any coatings brought about by exudation which may result in the formation of a large number of inhomogeneities in the plates. These inhomogeneities would in their turn lead to flaws in the half-tone surfaces of printing plates, which would make them useless for printing purposes.

Polymerizable compounds containing amide groups from which the N-methylol ethers used according to this invention may be prepared are preferably the amides of unsaturated, polymerizable carboxylic acids, such as acrylamide, methacrylamide, α-chloroacrylamide, α-phenylacrylamide, maleic diamide, fumaric diamide, citraconic diamide, N-acryloyl urea, N-methacryloyl urea and compounds having the General Formula I or II:

(I)

$$H_2C{=}CH{-}O{-}R^1{-}O{-}\overset{\displaystyle O}{\overset{\|}{C}}{-}NH_2$$

(II)

$$H_2C{=}CH{-}O{-}R^1{-}S{-}\overset{\displaystyle O}{\overset{\|}{C}}{-}NH_2$$

in which $R^1$ denotes a short-chain alkylene or cyclohexylene group containing up to 6 carbon atoms or the General Formula III:

(III)

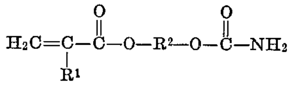

in which $R^1$ denotes a hydrogen atom or a methyl group and $R^2$ denotes a short-chain alkylene group or a phenylene group.

The compatibility of polyamides prepared from certain monomer classes with the monomers used according to this invention can be considerably improved if appropriately substituted derivatives of cyanuric acid having the General Formula IV or V are used for the production of the monomeric N-methylol ether compounds:

(IV)

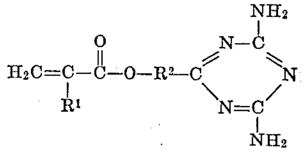

(V)

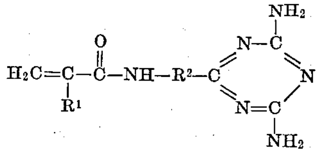

in which $R^1$ denotes a hydrogen atom or a methyl group and $R^2$ denotes a short-chain alkylene group which may be substituted. Polymerizable compounds containing amide groups for the purposes of this invention also mean the derivatives of polymerizable imides of organic acids, e.g. maleic imide.

The N-methylol ethers may be prepared in a conventional manner, e.g. from the methylol compounds of the said acid amides and acid amides similar to them. Monoalcohols as well as polyfunctional alcohols are suitable as conventional alcohols. These alcohols may be linear, branched or their main chain or side chains may be interrupted by heteroatoms. N-methylol ethers having at least 2 polymerizable double bonds are particularly suitable for the purposes of this invention; they may be built up differently, e.g. the bis-, tris- or multi-N-methylol ethers of the abovementioned N-methylolamides with bifunctional or polyfunctional alcohols, or methylol compounds etherified with unsaturated alcohols, the two principles, if desired, being united in one molecule when the bifunctional or polyfunctional alcohol itself contains polymerizable groups for example within its carbon skeleton or in the form of polymerizable ether groups or ester groups. N-methylol ethers of the abovementioned type are for example the corresponding N-methylol ethers of acrylamide and methacrylamide, e.g. the bis-, tris- and multi-ethers of glycol, propanediol-1,2 and propanediol-1,3, the butanediols, glycerol, trimethylol propane, pentacrylthritol and neopentyl alcohol. Preferred N-methylol ethers of another group are the allyl and methallyl ethers of N-methylolacrylamide and N-methylolmethacrylamide. A preferred methylol ether of a third group is for example the bis-ether of butenediol with N-methylolacrylamide or N-methylolmethacrylamide. The methylol ethers mentioned here may be used on their own, in admixture with each other or in admixture with other monofunctional or polyfunctional polymerizable compounds such as are usually employed in the production of printing plates based on polyamides.

The N-methylol ethers of monofunctional alcohols are particularly suitable when other monomers which contain at least two polymerizable double bonds are to be admixed with polyamides. In this case such mixtures exhibit the surprising property that they are much more compatible with the polyamides in the presence of such a N-methylol ether than without it. This repersents a considerable technical advance. Preferred examples of such N-methylol ethers are the N-methylol ethers of acrylamide and methacrylamide with methanol, ethanol, propanol, isopropanol, the butanols as well as N-methylol ethers of other aliphatic and cycloaliphatic alcohols. An example of a methylol ether which contains a heteroatom is the N-methylol ether of dimethylethanolamine.

These mixtures may also contain other compounds which contain only one polymerizable double bond.

Suitable monomers which can be employed together with the N-methylol ethers used according to this invention which contain two or more double bonds are monofunctional and polyfunctional monomers. Preferred polyfunctional monomers are those which contain amide groups in addition to double bonds, e.g. methylene bis-acrylamide, methylene-bis-methacrylamide and the bis-acrylamides or bis-methacrylamides of ethylene diamine, propylene diamine, butylene diamine, pentamethylene diamine, hexamethylene diamine, heptamethylene diamine, octamethylene diamine and of polyamines and other diamines which may be branched, interrupted by heteroatoms or contain cyclic systems. Monomers which contain urethane or urea groups as well as amide groups, such as the reaction produtcs of diol monacrylates and methacrylates with diisocyanates or the corresponding reaction products of the monoacrylamides of diamines with diisocyanates are also very suitable. Moreover, the diacrylates, triacrylates or polyacrylates and the dimethacrylates, trimethacrylates or polymethacrylates of dihydric or polyhydric alcohols and phenols. The use of bifunctional or polyfunctional polymerizable monomers is however not limited to the said selection. It also includes other monomers having at least two or more polymerizable double bonds provided they, either alone or in admixture with other monomers, particularly with the said N-methylol ethers, are miscible with the polyamides serving as base polymers for the printing reliefs; this may easily be determined by a small-scale experiment. Monomers which contain only one polymerizable double bond are advantageously selected from the conventional ones which are compatible with the polyamides or which, together with the methylol ethers used according to this invention, give mixtures that are compatible with the polyamides, e.g. preferably acrylates and methacrylates, such as the acrylates and methacrylates of methanol, ethanol and propanol. The esters of other polymerizable monocarboxylic and dicarboxylic acids are also suitable. All these esters of unsaturated carboxlic acids may contain in the alcohol component either heteroatoms in the chain or in addition functional groups, e.g. a hydroxyl group. Furthermore, all those monomers are suitable which, in admixture with the N-methylol ethers used in accordance with this invention and in the presence of photoinitiators, give polymerizable mixtures which are compatible with polyamides, e.g. styrene, the derivatives and substitution products thereof, vinyl esters, vinyl amines, vinyl lactams and, to a limited extent, vinyl ethers and allyl compounds provided they do not have an adverse effect upon the polymerization rate which is necessary for the intended purpose. If desired, the amino groups which from the start are present to a greater or lesser extent in a polyamide may be wholly or partly neutralized by unsaturated polymerizable carboxlic acids or the anhydrides thereof.

The plates from which the printing reliefs are prepared usually contain photoinitiators, i.e. compounds which decompose into radicals under the action of light and which start or accelerate the polymerization, for example vicinal ketaldonyl compounds, such as diacetyl or benzyl; α-ketaldonyl alcohols, such as benzoin; acyloin ethers, such as benzoinmethyl ether; α-substituted aromatic acyloins such as α-methylbenzoin. The photoinitiators are used in amounts of 0.01 to 10%, preferably 0.01 to 3%, by weight on the whole mixture.

If desired, conventional thermal polymerization inhibitors, such as hydroquinone, p-methoxyphenol, p-quinone, copper(I) chloride, methylene blue, β-naphthylamine, nitrites or phenols, may be used. Plasticizers, such as benzenesulfonic-n-butylamide, and high molecular weight compounds containing hydroxyl groups, such as polyethers or polyimines, may also be employed.

The plates and sheets of the mixtures used in accordance with this invention may be prepared by conventional methods, for example by dissolving the components, removing the solvent followed by molding, extrusion or rolling of the finely divided mixture. The solutions of the components may also be cast into plates or sheets.

High-energy lamps, such as carbon arcs, mercury vapor lamps, xenon lamps or fluorescent tubes can be used for exposing the plates.

The plates and sheets, after being exposed, are washed in a conventional manner, e.g. mechanically by rubbing out in the presence of solvents or solvent mixtures or by spraying with solvents or solvent mixtures under pressure. Printing plates produced in this way are suitable for letterpress printing, dry offset printing and intaglio printing. For this purpose the plates or sheets may be mounted on rigid or flexible bases of metal, wood, paper or plastics before or after exposure.

Preferred suitable linear synthetic polyamides are copolyamides which are soluble in conventional solvents or mixtures of solvents, such as lower aliphatic alcohols or mixtures of alcohol and water, ketones, aromatics or mixtures of benzene, alcohol and water, for example copolyamides prepared by conventional methods by polycondensation or activated anionic polymerization of two or more lactams having five to thirteen ring members. Examples of these lactams are caprolactam, oenanthlactam, capryllactam, laurolactam or corresponding C-substituted lactams, such as C-methyl-epsilon-caprolactam, epsilon-ethyl-epsilon-caprolactam or δ-ethyloenantholactam. The aminocarboxylic acids on which these lactams are based may be polycondensed instead of the lactams. Other very suitable copolyamides are polycondensation products of salts of the diamine-dicarboxylic acid type which have been prepared from at least three polyamide-forming starting materials. Examples of conventional dicarboxylic acids and diamines for this purpose are adipic acid, suberic acid, sebacic acid, dodecane dicarboxylic acid and equivalent substitution products, such as α,α-diethyladipic acid, α-ethylsuberic acid, ω,ω'-octane dicarboxylic acid or ω,ω'-nonane dicarboxylic acid or mixtures of the same as well as dicarboxylic acids containing aliphatic or aromatic ring systems; diamines, such as pentamethylene diamine, hexamethylene diamine, heptamethylene diamine, octamethylene diamine or C-substituted and/or N-substituted derivatives of these amines, such as N-methylhexamethylene diamine, N-ethylhexamethylene diamine, 1,6 - diamino - 3 - methylhexane, cycloaliphatic or aromatic diamines, such as m-phenylene diamine, m-xylylene diamine, and 4,4'-diaminodiphenylmethane, the bridging groups between the two carboxylic acid groups or amino groups being optionally interrupted by heteroatoms. Copolyamides which are particularly suitable are those which have been prepared by cocondensation of a mixture of one or more lactams and at least one salt of a dicarboxylic acid and diamine, for example epsilon-caprolactam, hexamethylene diammonium adipate and p,p'-diamindicyclohexylmethane adipate.

The invention is illustrated by the following examples in which the parts and percentages are by weight.

EXAMPLE 1

A solution of 100 parts of a copolyamide (which has been prepared in a conventional manner by polycondensation of a mixture of 35 parts of hexamethylene diammonium adipate, 35 parts of the salt of 4,4'-diaminodicyclohexylmethane and adipic acid and 30 parts of epsilon-caprolactam), 80 parts of the ethylene glycol-bis-ether of N-methylolacrylamide, 1 part of benzoin methyl ether and 0.025 part of hydroquinone in 400 parts of methanol is poured into dishes and placed in a current of air. After the solvent has evaporated, the coarsely comminuted product is dried for 24 hours in vacuo in a vacuum drying cabinet and then granulated. The granulate is molded at 150° C. into a layer 0.8 mm. thick on a sheet of aluminum whose surface has been roughened. The sheet provided with the photopolymerizable layer is then exposed for 8 minutes in a copying frame through a combined half-tone/line negative by means of fluorescent tubes (type Philips TLA 40/05) arranged at a distance of 5 cm. from the surface of said sheet. The exposed plate is then sprayed for 12 minutes with a mixture of propanol, ethanol and water (21:63:16% by volume) at 30° C. at a pressure of 3.5 atmospheres by means of a number of jets. A relief printing plate with a raised image at the exposed areas is obtained which faithfully reproduces every detail of the combined half-tone/line negative used and can be run on a letterpress. The maximum depth at the unexposed areas is 0.8 mm.

EXAMPLE 2

The procedure of Example 1 is followed, but the glycol-bis-ether of N-methylolmethacrylamide is used instead of the ethylene glycol-bis-ether of N-methylolacrylamide. The printing plate obtained was identical with that of Example 1.

EXAMPLE 3

A solution of 100 parts of the alcohol-soluble polyamide described in Example 1, 80 parts of the allyl ether of N-methylolacrylamide, 1 part of benzoin methyl ether and 0.05 part of p-methoxyphenol in 400 parts of methanol is rolled on a roll mill at 60° to 70° C. into a rough sheet free from solvent. After the rough sheet has been reduced in size, a printing plate with an aluminum base is prepared as described in Example 1. The source of light consists of several fluorescent tubes of the same type and arranged in the same manner as described in Example 1. After the plate has been exposed through a combined half-tone/line negative, it is washed with a mixture of propanol and water (80:20% by volume) at 30° C. Washing is carried out mechanically in an apparatus in which several jets spray the plate with the solvent mixture. After 13 minutes the unexposed areas are washed out down to the aluminum base. The resultant printing relief can be immeditaely used on a letter press.

EXAMPLE 4

The procedure of Example 3 is followed, but the allyl ether of N-methylolmethacrylamide is used instead of the allyl ether of N-methylolacrylamide. A relief printing plate is obtained which exhibits excellent image sharpness.

EXAMPLE 5

35 parts of the bis-glycol ether of N-methylolacrylamide, 15 parts of triethylene glycol diacrylate, 10 parts of hexamethylene-bis-acrylamide, 1 part of benzoin methyl ether and 0.03 part of hydroquinone are dissolved in a solution of 100 parts of the soluble polyamide described in Example 1 in 400 parts of methanol. The solution is rolled on a roll mill until it is free from methanol. The rough sheet is removed from the rolls and, after cooling, is reduced in size. The granulate is applied in a layer 0.8 mm. thick to a sheet of aluminum 0.9 mm. in thickness in a press at 170° C.

The coated aluminum sheet is exposed for 7 minutes in a copying frame through a combined half-tone/line negative by means of the source of light described in Example 1.

The exposed plate is then washed with a solvent mixture of benzene, methanol and water (20:70:10% by volume). For this purpose the plate is sprayed at an angle of 90° with the solvent mixture at a pressure of 3 atmospheres by means of jets. After 12 minutes the non-exposed areas are dissolved out down to the metal base. After the plate has been dried with warm air for a short period, it can be used in a letterpress. Every detail of the test negative used is reproduced in the printing relief.

EXAMPLE 6

60 parts of the bis-glycol ether of N-methylolacrylamide, 10 parts of styrene, 10 parts of butanediol monoacrylate, 1 part of benzoin methyl ether and 0.03 part of hydroquinone are dissolved in a solution of 100 parts of a copolyamide (prepared by polycondensation of 33 parts of hexamethylene diammonium adipate, 37 parts of p,p'-diaminodicyclohexylmethane adipate and 30 parts of epsilon-caprolactam) in 300 parts of methanol.

The dissolved mixture is freed from solvent in large, open vessels and the residue is molded on an aluminum sheet as described in Example 1. The plate is exposed and washed according to the procedure indicated in Example 5. A printing plate having an outstanding image is obtained which is very suitable for letterpress printing.

EXAMPLE 7

A solution of 100 parts of the polyamide described in Example 6 in 400 parts of methanol is mixed with a solution of 60 parts of N-methylolacrylamide allyl ether, 15 parts of triethylene glycol diacrylate, 5 parts of methylene-bis-acrylamide, 1 part of benzoin methyl ether and 0.1 part of p-methoxyphenol in 100 parts of methanol.

One part of this mixture is evenly applied to a coppered gravure cylinder and dried.

The cylinder provided with a light-sensitive coating 0.1 mm. thick is then exposed through a transparency conventionally used in intaglio printing. A collimator with a xenon lamp arranged at a distance of 20 cm. from the surface of the cylinder serves as the source of light. During exposure, the cylinder is rotated around its longitudinal axis in order to expose the surface evenly.

The exposed cylinder is then washed evenly with a mixture of benzene, methanol and water (20:70:10% by volume). Washout is ended after 2 minutes, whereupon the cylinder is rinsed clear with benzene and then dried with warm air. The depth of the deepest areas, i.e. the areas which release the greatest amount of ink, is 0.04 mm. The areas which give lighter shades are not so deep.

The cylinder is used on a rotogravure press and gives very good printed copies which are comparable with those obtained with etched copper cylinders.

EXAMPLE 8

A solution is prepared from 100 parts of the polyamide described in Example 1, 60 parts of N-methylolacrylamide allyl ether, 5 parts of 1,4-butanediol monoacrylate, 5 parts of styrene, 5 parts of methyl methacrylate, 1 part of benzoin methyl ether, 0.1 part of p-methoxyphenol and 500 parts of methanol which is used in the manner described in Example 7 for coating a gravure cylinder. The procedure of Example 7 is followed for the preparation of a gravure cylinder which is ready for use, gives satisfactory printed copies and exhibits excellent resistance to chemicals and wear.

EXAMPLE 9

100 parts of the polyamide described in Example 1, 35 parts of hexamethylene-bis-acrylamide, 18 parts of triethylene glycol diacrylate, 10 parts of N-methylolacrylamide methyl ether, 1 part of benzoin methyl ether and 0.05 part of hydroquinone are dissolved in 300 parts of methanol. The solution is spray-dried to form a dry, fine granulate which is nearly free from solvent. The remaining solvent is removed by drying at room temperature in a vacuum drying cabinet. A flexible steel sheet 0.3 mm. thick tin-plated on the rear side is coated with the dry product in a press at 170° C. The thickness of the layer is 0.5 mm. The flexible plate is exposed and washed as described in Example 1. The exposure time is 7 minutes and washout lasts for 8 minutes. After drying, the plate is used as a wrap-around plate on a sheet-fed rotary letterpress. The printed copies are characterized by excellent reproduction of even very fine lines and half-tone dots.

We claim:

1. A printing plate comprising a supporting base to which there is applied a photosensitive layer consisting essentially of a mixture of (a) 75 to 30% by weight of a solvent-soluble linear saturated synthetic polyamide, and (b) 25 to 70% by weight of a monomeric N-methylol ether compound having at least one etherified N-methylol amide group and at least two photopolymerizable carbon-carbon double bonds, said mixture containing a small amount of a polymerization inhibitor and a photoinitiator.

2. A printing plate as claimed in claim 1 in which said monomeric N-methylol ether compound is partly replaced by at least one other compatible photopolymerizable monomer.

3. A printing plate as claimed in claim 2 wherein said other compatible photo-polymerizable monomer is derived from a compound having the formula

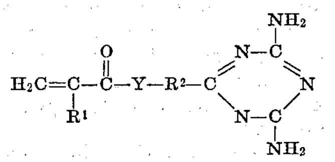

wherein $R^1$ denotes hydrogen or methyl, $R^2$ denotes alkylene of up to 6 carbon atoms and Y denotes —O— or —NH—, the nitrogen atom of the amino groups on the triazole ring being substituted by the methylol group which in turn is etherified by an aliphatic or cycloaliphatic alcohol.

4. A printing plate as claimed in claim 1 wherein said N-methylol ether compound is an N-methylolamide of an unsaturated photopolymerizable carboxylic acid etherified with an aliphatic or cycloaliphatic alcohol.

5. A printing plate as claimed in claim 4 wherein said N-methylolamide is selected from the class consisting of N-methylolacrylamide and N-methylolmethacrylamide.

6. A printing plate as claimed in claim 1 wherein said N-methylol ether compound is derived from a compound having the formula $$H_2C{=}C{-}O{-}R^1{-}X{-}\overset{\overset{\displaystyle O}{\|}}{C}{-}NH_2$$

wherein $R^1$ denotes alkylene of up to 6 carbon atoms and X denotes —O— or —S—, the nitrogen atom being substituted by the methylol group which in turn is etherified by an aliphatic or cycloaliphatic alcohol.

7. A printing plate as claimed in claim 1 wherein said N-methylol ether compound is derived from a compound having the formula $$H_2C{=}\underset{\underset{\displaystyle R^1}{|}}{C}{-}\overset{\overset{\displaystyle O}{\|}}{C}{-}O{-}R^2{-}O{-}\overset{\overset{\displaystyle O}{\|}}{C}{-}NH_2$$

wherein $R^1$ denotes hydrogen or methyl and $R^2$ denotes alkylene of up to 6 carbon atoms or phenylene, the nitrogen atom being substittued by the methylol group which in turn is etherified by an aliphatic or cycloaliphatic alcohol.

8. A printing plate as claimed in claim 1 wherein said N-methylol ether compound is the bis-ether of a 1,ω-diol having 2 to 6 carbon atoms with a compound selected from the class consisting of N-methylolacrylamide and N-methylolmethacrylamide.

9. In a process for the production of printing plates in which a plate or sheet having a photosensitive layer containing about 75 to 30% by weight of a solvent-soluble linear saturated synthetic polyamide, about 25 to 70% by weight of at least one photopolymerizable monomer and a small amount of a polymerization inhibitor and a photoinitiator is exposed through a negative or positive followed by removal of the non-exposed areas down to a desired depth with a solvent, the improvement which comprises employing as the essential photopolymerizable monomer in said photosensitive layer a monomeric N-methylol ether compound having at least one etherified N-methylol amide group and at least two photopolymerizable carbon-carbon double bonds.

10. A process as claimed in claim 9 wherein said monomeric N-methylol ether compound is partly replaced by at least one other compatible photopolymerizable monomer.

11. A process as claimed in claim 3 wherein said N-methylol ether compound is a N-methylolamide of an unsaturated photopolymerizable carboxylic acid etherified with an aliphatic or cycloaliphatic alcohol.

References Cited

UNITED STATES PATENTS

| | | | |
|---|---|---|---|
| 2,972,540 | 2/1961 | Saner et al. | 96—115 |
| 2,997,391 | 8/1961 | Murray et al. | 96—35.1 |
| 3,081,168 | 3/1963 | Leekley et al. | 96—35.1 |

FOREIGN PATENTS

| | | | |
|---|---|---|---|
| 826,272 | 12/1959 | Great Britian | 96—115 |

RONALD S. SMITH, Primary Examiner

U.S. Cl. X.R.

96—115

PO-1050
(5/69)

UNITED STATES PATENT OFFICE
CERTIFICATE OF CORRECTION

Patent No. 3,551,148 Dated December 29, 1970

Inventor(s) Gerhard Faulhaber et al

It is certified that error appears in the above-identified patent and that said Letters Patent are hereby corrected as shown below:

Column 1, line 4, "Mennheim" should read -- Mannheim --.

Column 3, line 61, "produtcs" should read -- products --.

Column 4, line 10, "carboxlic" should read -- carboxylic --.

Column 6, line 7, "immeditaely" should read -- immediately --.

Column 8, line 54, claim 11, "3" should read -- 9 --; line 66, "Britian" should read -- Britain --.

Signed and sealed this 1st day of June 1971.

(SEAL)
Attest:

EDWARD M.FLETCHER,JR.
Attesting Officer

WILLIAM E. SCHUYLER, JR.
Commissioner of Patents